US008920618B2

(12) United States Patent
Yang et al.

(10) Patent No.: US 8,920,618 B2
(45) Date of Patent: Dec. 30, 2014

(54) COMBINATORIAL PROCESSING USING HIGH DEPOSITION RATE SPUTTERING

(75) Inventors: Hong Sheng Yang, Pleasanton, CA (US); Zhendong Hong, San Jose, CA (US); Chi-I Lang, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 53 days.

(21) Appl. No.: 13/339,648

(22) Filed: Dec. 29, 2011

(65) Prior Publication Data

US 2013/0167773 A1 Jul. 4, 2013

(51) Int. Cl.
*C23C 14/54* (2006.01)

(52) U.S. Cl.
USPC ............. 204/298.11; 204/298.26; 204/298.07

(58) Field of Classification Search
CPC .............. H01J 37/3417; H01J 37/3429; H01J 37/3447; H01J 37/3473; C23C 14/0084; C23C 14/3492; C23C 14/54
USPC ........................... 204/298.26, 298.07, 298.11
See application file for complete search history.

(56) References Cited

U.S. PATENT DOCUMENTS

| 4,038,171 | A  | * | 7/1977 | Moss et al. ............... 204/298.06 |
| 6,217,730 | B1 | * | 4/2001 | Nakajima et al. ........ 204/298.11 |
| 7,767,627 | B1 | * | 8/2010 | Goldwasser et al. ........... 506/22 |
| 2005/0199490 | A1 | * | 9/2005 | Nomura et al. .......... 204/298.11 |

* cited by examiner

Primary Examiner — Jason M Berman

(57) ABSTRACT

Apparatuses and methods for high-deposition-rate sputtering for depositing layers onto a substrate are disclosed. The apparatuses generally comprise a process chamber; one or more sputtering sources disposed within the process chamber, wherein each sputtering source comprises a sputtering target; a substrate support disposed within the process chamber; a shield positioned between the sputtering sources and the substrate, the shield comprising an aperture positioned under each sputtering source; and a transport system connected to the substrate support capable of positioning the substrate such that one of a plurality of site-isolated regions on the substrate can be exposed to sputtered material through the aperture positioned under each of the sputtering sources; wherein the spacing between the sputtering target and the substrate is less than 100 mm. The apparatus enables high deposition rate sputtering onto site-isolated regions on the substrate.

15 Claims, 6 Drawing Sheets

COMBINATORIAL PROCESSING USING HIGH DEPOSITION RATE SPUTTERING

FIELD OF THE INVENTION

One or more embodiments of the present invention relate to methods and apparatuses for combinatorial processing using high rate of sputter deposition of thin films.

CROSS REFERENCE TO RELATED APPLICATION

This application is related to co-owned U.S. patent application Ser. No. 13/281,316 entitled "High Metal Ionization Sputter Gun," filed on Oct. 25, 2011, which is incorporated herein by reference.

BACKGROUND

Physical vapor deposition (PVD) is commonly used within the semiconductor industry as well as within solar, glass coating, and other industries, in order to deposit a layer over a substrate. Sputtering is a common physical vapor deposition method, where atoms or molecules are ejected from a target material by high-energy particle bombardment and then deposited onto the substrate.

In order to identify different materials, evaluate different unit process conditions or parameters, or evaluate different sequencing and integration of processes, and combinations thereof, it may be desirable to be able to process different regions of the substrate differently. This capability, hereinafter called "combinatorial processing," is generally not available with tools that are designed specifically for conventional full substrate processing. Furthermore, it may be desirable to subject localized regions of the substrate to different processing conditions (e.g., localized deposition) in one step of a sequence followed by subjecting the full substrate to a similar processing condition (e.g., full substrate deposition) in another step.

Current full-substrate PVD tools used in the semiconductor industry have a large sputtering source including a large sputtering target, i.e., the target is larger than the substrate in order to deposit a uniform layer on the substrate, even for substrates as large as 300 mm wafer. Alternatively, some full substrate PVD tools use a smaller sputtering source, e.g., 3" or 4" diameter target, and rotate the wafer in order to deposit a uniform film, where the substrate may be 200 mm diameter or smaller, and the sputtering source is pointed to approximately the mid-radius of the substrate. In these methods, the target-to-substrate spacing is relatively large, e.g., 200 mm, requiring significant space between the sputtering source and the substrate in order to deposit a uniform film on the full substrate.

Combinatorial processing chambers typically include smaller sputtering sources. However, deposition rates can suffer. A plurality of small sputtering sources aimed at a common location on a substrate must be positioned at a significant distance from the substrate to ensure good uniformity of the deposited film within an isolated spot. Particularly for thick film applications such as the formation of metal and metal nitride electrodes, process times of several hours are common. Significant contamination and poor film quality are common byproducts of long processing time.

SUMMARY OF THE INVENTION

Embodiments of the present invention provide apparatuses for combinatorial processing using high-deposition-rate sputtering for depositing layers onto a substrate. A high deposition rate of sputtering is provided by locating the sputtering source much closer to the substrate than is practiced in prior art deposition methods. The apparatuses generally comprise a process chamber; one or more sputtering sources disposed within the process chamber; a substrate support operable to support a substrate; a shield positioned between the sputtering sources and the substrate, the shield comprising an aperture positioned under each sputtering source; and a transport system connected to the substrate support capable of positioning the substrate such that one of a plurality of site-isolated regions on the substrate can be exposed to sputtered material through the aperture positioned under each of the sputtering sources. Each sputtering source comprises a sputtering target, and the spacing between the sputtering target and the substrate is less than 100 mm.

The apparatus is operable to vary one or more process parameters comprising one or more sputtering parameters, sputtering atmosphere parameters, substrate parameters, or combinations thereof. The process parameters can be varied in a combinatorial manner among the plurality of site-isolated regions. The sputtering parameters typically comprise exposure times, power, sputtering target material, target-to-substrate spacing, or combinations thereof. The sputtering atmosphere parameters comprise total pressure, carrier gas composition, carrier gas flow rate, reactive gas composition, reactive gas flow rate, or combinations thereof. The reactive gas flow rate can be greater than or equal to zero in order to vary the reactive gas composition in an inert carrier gas. The substrate parameters comprise substrate material, surface condition, substrate temperature, substrate bias, or combinations thereof. The sputtering source is oriented approximately normal to the substrate so that the sputtering gap is minimized while providing uniform sputtering to all portions of the site-isolated region on the substrate. In some embodiments, the sputtering gap is between about 20 mm and about 100 mm. In some embodiments, the sputtering gap is between about 50 mm and about 75 mm.

The apparatus can further comprise an aperture shutter for each aperture, wherein the aperture shutter is moveably disposed over the aperture. The substrate support is capable of providing independent substrate temperature control and applying a bias voltage. The apparatus can further comprise a plurality of sputtering sources, such as two, three, four, five, or six sputtering sources. The apertures typically have an opening smaller than the substrate so that a plurality of discrete regions of the substrate can be subjected to distinct process conditions in a combinatorial manner.

Embodiments of the present invention also include methods of depositing layers on a substrate in a combinatorial manner. The methods generally comprise exposing a first site-isolated region of a surface of a substrate to material from a sputtering source under a first set of process conditions, and exposing a second site-isolated region of a surface of the substrate to material from a sputtering source under a second set of process conditions. During exposure of the surface of the substrate to the sputtering source, the remaining area of the substrate is not exposed to the material from the sputtering target, enabling site-isolated deposition of sputtered material onto the substrate. The method can further comprise exposing three or more site-isolated regions of the substrate to material from a sputtering source under distinct sets of process conditions.

DETAILED DESCRIPTION

Figure 1:
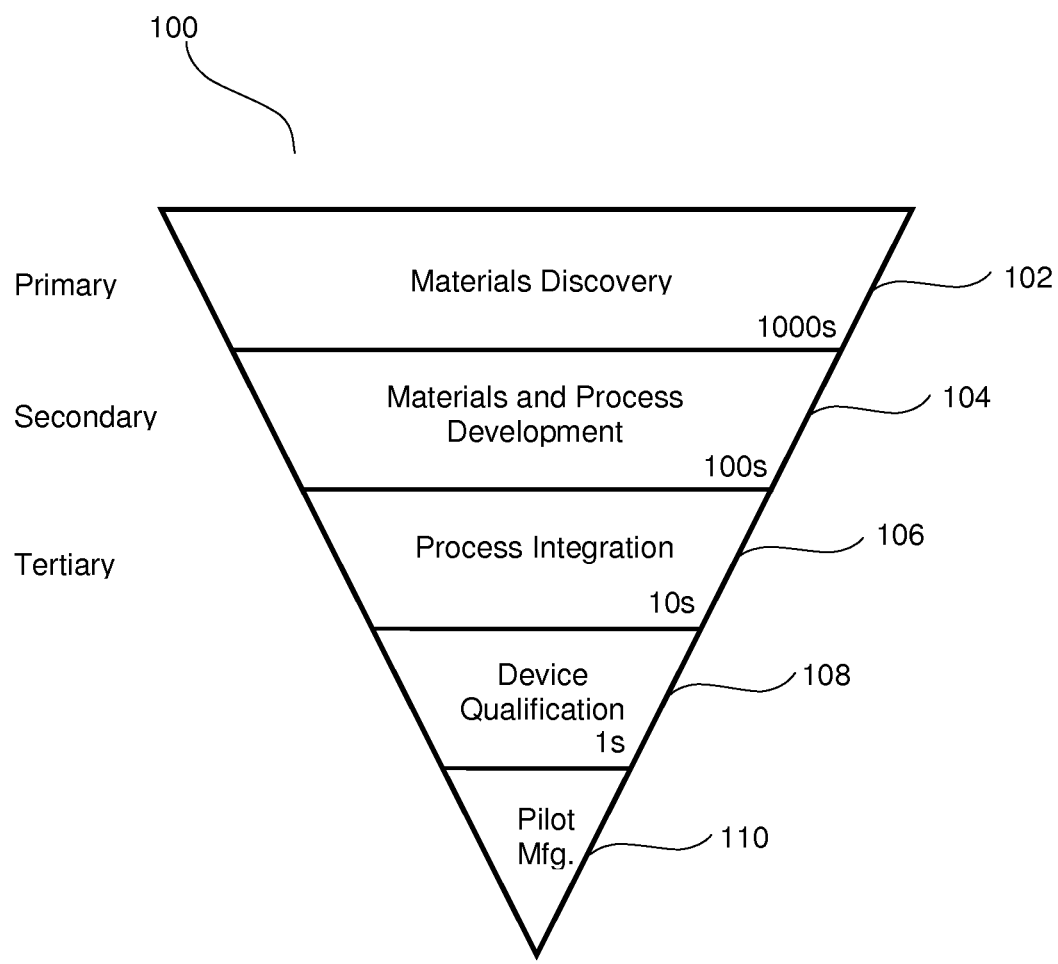
FIG. 1 is a schematic diagram for implementing combinatorial processing and evaluation.

Before the present invention is described in detail, it is to be understood that unless otherwise indicated this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

Definitions

The term "site-isolated" as used herein refers to providing distinct processing conditions, such as controlled temperature, flow rates, time of processing and plasma composition, plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the intended conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material made by processing conditions that are distinct from one site-isolated region to another. The site-isolated region can include one region and/or a series of regular or periodic regions predefined on the substrate. The site-isolated region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, silica, sapphire, zinc oxide, SiC, AN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Substrate shapes and sizes can vary and include commonly used round wafers of 2", 4", 200 mm, or 300 mm in diameter.

The term "high-deposition-rate sputtering" as used herein refers to the use of a conventional sputtering source positioned much closer than normal (e.g., at a spacing of about 20-100 mm from the substrate) such that the flux of sputtered material to the substrate is 2-4 times normal. Any sputtering source (RF or DC, reactive or inert) can be used.

Embodiments of the present invention provide apparatuses and methods for systematic exploration of deposition process variables in a combinatorial manner at a high deposition sputtering rate, with the possibility of performing many process variations on a single substrate. The high deposition rate combinatorial processing permits efficient use of resources and materials to optimize process conditions and design of novel materials. Commonly-owned co-pending U.S. patent application Ser. No. 13/281,316 discloses a "High Metal Ionization Sputter Gun," which achieves high levels of metal ionization by using brief pulses of high power to the sputtering source power source separated by cooling intervals; the average duty cycle is less than 30%, and average deposition rates are low. Embodiments of the present invention provide the ability to achieve a high sputter deposition rate using multiple sputter guns for combinatorial processing of a substrate while maintaining good uniformity of the deposited film.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention.

While the combinatorial processing varies certain materials, hardware details, or process sequences, the composition or thickness of the layers or structures or the actions, such as cleaning, surface preparation, deposition, surface treatment, etc. is substantially uniform through each discrete site-isolated region. Furthermore, while different materials or processes may be used for corresponding layers or steps in the formation of a structure in different regions of the substrate during the combinatorial processing, the application of each layer or use of a given process is substantially consistent or uniform throughout the different regions in which it is intentionally applied. Thus, the processing is uniform within a region (inter-region uniformity) and between regions (intra-region uniformity), as desired. It should be noted that the process can be varied between site-isolated regions, for example, where a thickness of a layer is varied or a material may be varied between the regions, etc., as desired by the design of the experiment.

The result is a series of site-isolated regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each site-isolated region are designed to enable valid statistical analysis of the test results within each region and across regions to be performed.

Figure 2:
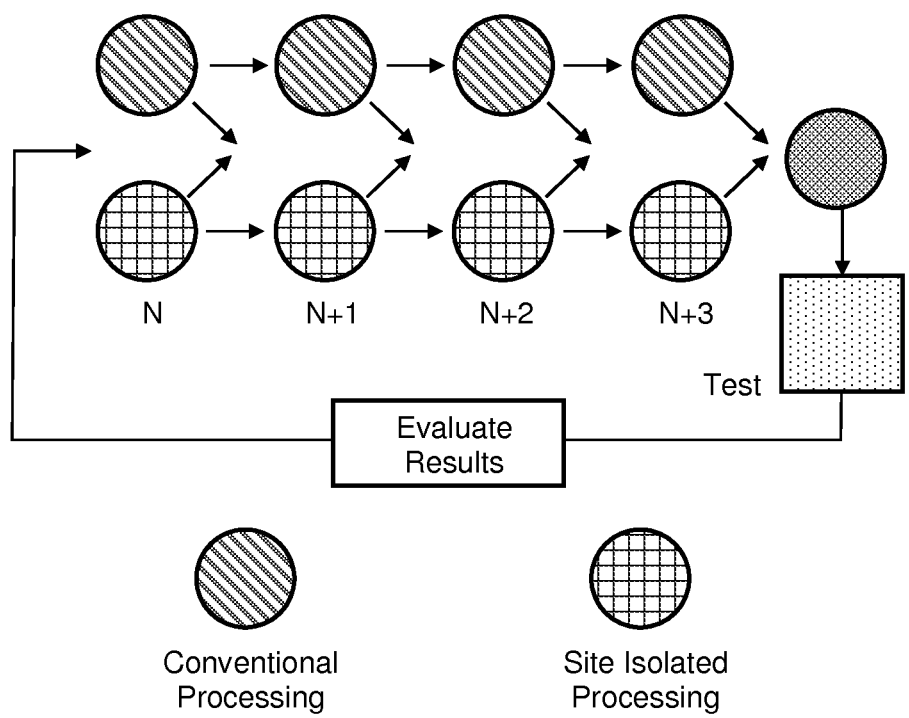
FIG. 2 is a schematic diagram for illustrating various process sequences using combinatorial processing and evaluation.

FIG. 2 is a simplified schematic diagram illustrating a general methodology for combinatorial process sequence integration that includes site-isolated processing and/or conventional processing in accordance with one embodiment of the invention. In one embodiment, the substrate is initially processed using conventional process N. In one exemplary embodiment, the substrate is then processed using site-isolated process N+1. During site-isolated processing, an HPC module may be used, such as the HPC module described in U.S. patent application Ser. No. 11/352,077 filed on Feb. 10, 2006. The substrate can then be processed using site-isolated process N+2, and thereafter processed using conventional process N+3. Testing is performed and the results are evaluated. The testing can include physical, chemical, acoustic, magnetic, electrical, optical, etc. tests. From this evaluation, a particular process from the various site-isolated processes (e.g., from steps N+1 and N+2) may be selected and fixed so that additional combinatorial process sequence integration may be performed using site-isolated processing for either process N or N+3. For example, a next process sequence can include processing the substrate using site-isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above process flows can be applied to entire monolithic substrates, or portions of the monolithic substrates.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, the order in which materials are deposited, hardware details of the gas distribution assembly, etc. It should be appreciated that these process parameters are exemplary and not meant to be an exhaustive list as other process parameters commonly used with remote plasma exposure systems may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Embodiments of the present invention provide apparatuses for high-deposition-rate sputtering for depositing layers onto a substrate, and provide the ability to achieve high deposition rates without damaging the sputtering source. A high deposition rate of sputtering is provided by locating the sputtering source much closer to the substrate than is practiced in prior art deposition methods, and by orienting the sputtering sources normal to the substrate, rather than tilting the sputtering source as is common in prior art deposition apparatuses. In some embodiments, the sputtering source is located as close as possible to an aperture adjacent to but not touching the substrate while not interfering with the sputtering process.

The apparatuses generally comprise a process chamber, one or more sputtering sources, and a transport system capable of positioning the substrate such that any area of the substrate can be exposed to sputtered material. The apparatuses can further comprise an aperture positioned under each sputtering source, with the aperture oriented normal to the substrate and located adjacent to but not touching the substrate. The aperture typically has an opening smaller than the substrate so that discrete regions of the substrate can be subjected to distinct process conditions in a combinatorial manner. However, there is no particular limit on the size of the aperture. Typical apertures can range from a minimum of about 10 mm in one dimension, and can be square, round, or rectangular, for example. For combinatorial processing, the apertures are small enough such that films can be deposited on a plurality of site-isolated regions on a substrate. For high deposition rate sputtering to coat an entire substrate, the aperture can be up to approximately full substrate size.

The process chamber provides a controlled atmosphere so that sputtering can be performed at any gas pressure or gas composition necessary to perform the desired combinatorial processing. Typical processing gases include argon, oxygen, hydrogen, or nitrogen. However, additional gases can be used as desired for particular applications.

The transport system comprises a substrate support capable of controlling substrate temperature up to about 550C., and applying a bias voltage of a few hundred volts.

Embodiments of the present invention include methods of depositing layers on a substrate with a high deposition rate, and in a combinatorial manner. The methods generally comprise exposing a first site-isolated region of a surface of a substrate to material from a sputtering source under a first set of process parameters, and exposing a second site-isolated region of a surface of the substrate to material from a sputtering source under a second set of process parameters. During exposure of the surface of the substrate to the sputtering source, the remaining area of the substrate is not exposed to the material from the sputtering target, enabling site-isolated deposition of sputtered material onto the substrate. The method can further comprise exposing three or more site-isolated regions of the substrate to material from a sputtering source under distinct sets of process parameters. The method can further comprise depositing additional layers onto any site-isolated region to build multi-layered structures if desired. In this manner, a plurality of process conditions to deposit one or a plurality of layers can be explored on a single substrate under distinct process parameters.

The process parameters that can be combinatorially varied generally comprise sputtering parameters, sputtering atmosphere parameters, substrate parameters, or combinations thereof. Sputtering parameters typically comprise exposure times, power, sputtering target material, target-to-substrate spacing, or a combination thereof. Sputtering atmosphere parameters typically comprise total pressure, carrier gas composition, carrier gas flow rate, reactive gas composition, reactive gas flow rate, or combinations thereof. The reactive gas flow rate can be set to greater than or equal to zero in order to vary the reactive gas composition in an inert carrier gas. The substrate parameters typically comprise substrate material, surface condition (e.g., roughness), substrate temperature, substrate bias, or combinations thereof.

Substrates can be a conventional round 200 mm, 300 mm, or any other larger or smaller substrate/wafer size. In other embodiments, substrates may be square, rectangular, or other shape. One skilled in the art will appreciate that substrate may be a blanket substrate, a coupon (e.g., partial wafer), or even a patterned substrate having predefined regions. In some embodiments, a substrate may have regions defined through the processing described herein.

Figure 3:
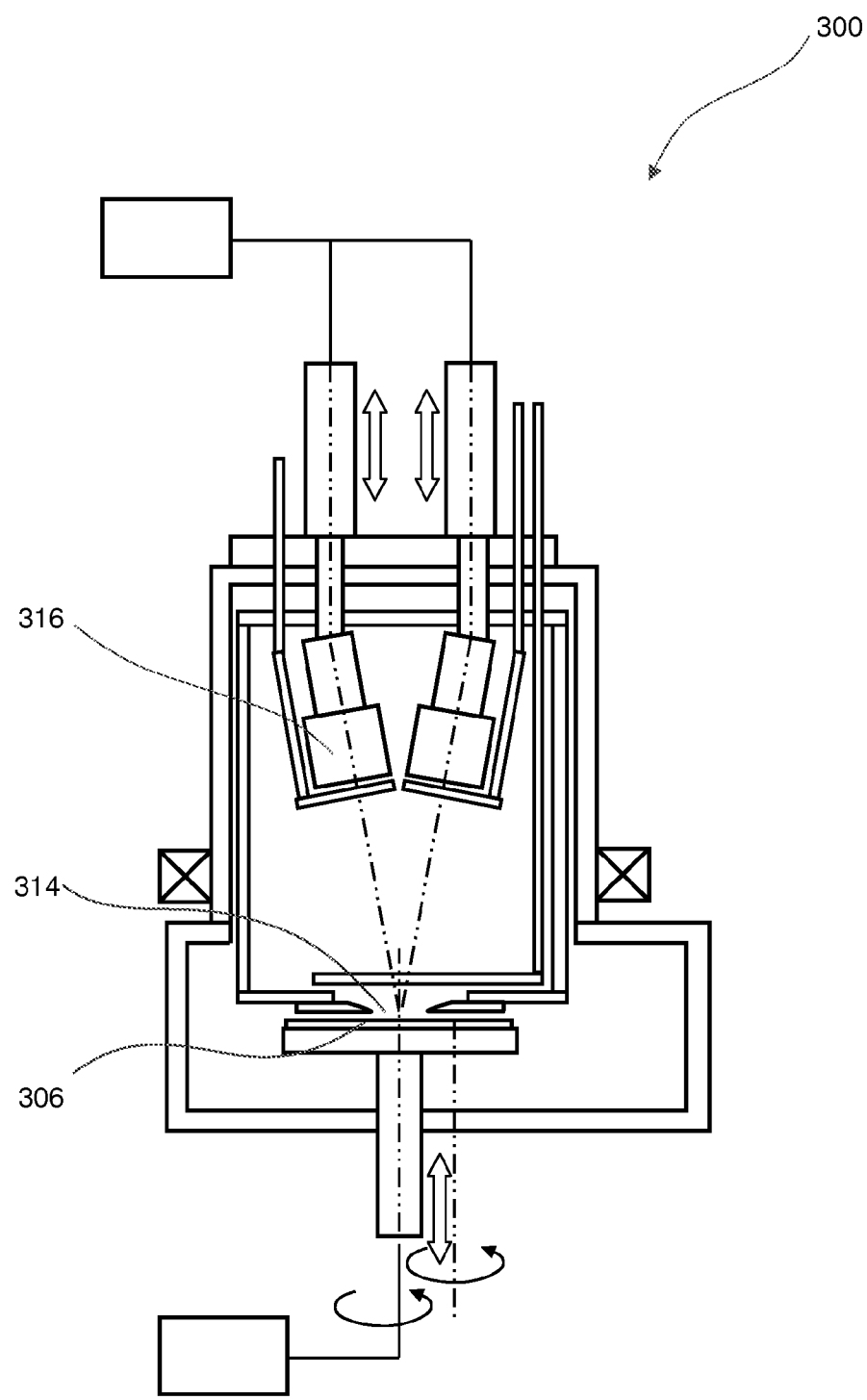
FIG. 3 shows an illustrative embodiment of a typical multi-source prior art sputtering system.

Software is provided to control the process parameters for each substrate for the combinatorial processing. Examples of process parameters that can be controlled by software include one or more sputtering parameters, such as exposure times, power, sputtering target, material, target-to-substrate spacing, sputtering atmosphere parameters, such as total pressure, carrier gas composition, carrier gas flow rate, reactive gas composition, reactive gas flow rate or combinations thereof; substrate parameters, such as substrate material, surface condition such as roughness, substrate temperature, substrate bias, or combinations thereof, FIG. 3 is a simplified schematic diagram illustrating a sputter chamber configured to perform combinatorial processing using prior art sputtering systems. A plurality of sputtering sources 316 are positioned at an angle so that they can be aimed through a single aperture 314 to a site-isolated region on a substrate 306. The sputtering sources 316 are positioned at least 100-300 mm from the aperture 314 to ensure uniform flux to the substrate within the site-isolated region. Additional components shown may be similar or identical to the components in the illustrative embodiment of the present invention shown in FIG. 4.

Figure 4:
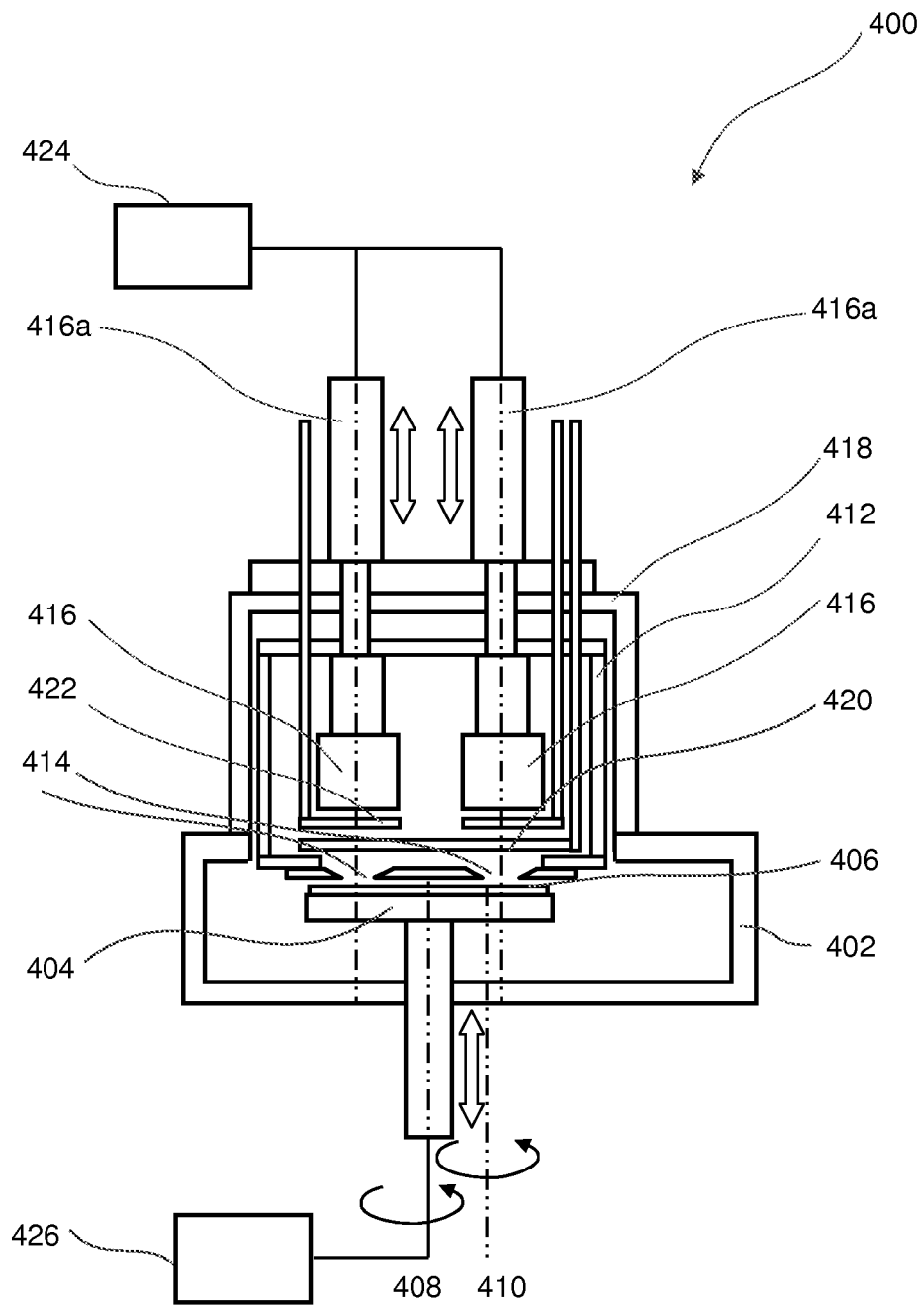
FIG. 4 shows an illustrative embodiment of a high deposition rate sputtering system according to the present invention.

FIG. 4 is a simplified schematic diagram illustrating a sputter chamber configured to perform combinatorial processing in accordance with some embodiments of the present invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support can be useful for combinatorial processing using site-isolated mechanisms. Other substrate supports, such as an X-Y table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406, and produces a bias voltage on substrate 406. Substrate 406 can be a conventional round 200 mm, 300 mm, or any other larger or smaller substrate/wafer size. In other embodiments, substrate 406 can be square, rectangular, or other suitable shape. One skilled in the art will appreciate that substrate 406 can be a blanket substrate, a coupon (e.g., partial wafer), or even a patterned substrate having predefined regions. In another embodiment, substrate 406 can have regions defined through the processing described herein.

Top chamber portion 418 of chamber 400 in FIG. 4 includes shield 412, which defines a confinement region over a radial portion of substrate 406. Shield 412 is a sleeve having a base (optionally integrated with the shield) and an optional top within chamber 400 that can be used to confine a plasma generated therein. The generated plasma dislodges atoms from a sputtering target (causing material to be ejected from the sputtering target) and the sputtered atoms are deposited on a site-isolated region of the substrate 406. Deposition can be performed in an inert gas atmosphere (e.g., an argon carrier gas) to deposit materials such as pure metals, or in the presence of reactive gases such as nitrogen or oxygen to deposit molecules such as metal oxides or metal nitrides. Neutral atoms or molecules (optionally in an excited electronic state) can be deposited. Alternatively, ions can be deposited, in which case a substrate bias voltage can be used advantageously to tune the energy of the ions arriving at the site-isolated region. Chamber pressure and gas flow rates can be adjusted to control the process; for example, the stoichiometry of layers formed in a reactive atmosphere can be tuned by adjusting the relative flow rate of the reactive gas(es).

Shield 412 is capable of being moved in and out of chamber 400, i.e., the shield is a replaceable insert. Shield 412 includes an optional top portion, sidewalls and a base. In some embodiments, shield 412 is configured in a cylindrical shape, however, the shield may be any suitable shape and is not limited to a cylindrical shape.

The base of shield 412 includes a plurality of apertures 414 in an aperture plate through which one or more site-isolated region of the surface of substrate 406 is exposed for deposition or some other suitable semiconductor processing operations. Aperture shutter 420 is moveably disposed over the base of shield 412. In some embodiments, aperture shutter 420 can be moved across a bottom surface of the base of shield 412 in order to cover or expose one or more apertures 414. Typically, only one aperture is uncovered at any one time to prevent cross-contamination between site-isolated regions. In some embodiments, aperture shutter 420 is controlled through an arm extension which moves the aperture shutter to expose or cover an aperture 414. It should be noted that although a single aperture per sputtering source is illustrated, multiple apertures may be included for each sputtering source. Each aperture can be associated with a dedicated aperture shutter or an aperture shutter can be configured to cover more than one aperture simultaneously or separately. Alternatively, aperture 414 can be a larger opening and aperture shutter 420 can extend with that opening to either completely cover the aperture or place one or more fixed apertures within that opening for processing the defined regions. The dual rotary substrate support 404 is useful to the site-isolating mechanism, and allows any location of the substrate or wafer to be placed under the aperture 414. Hence, site-isolated deposition is possible at any location on the wafer/substrate.

A sputtering source shutter, 422 can also be included. Sputtering source shutter 422 functions to seal off a deposition source when the deposition source may not be used for the processing in some embodiments. For example, two sputtering sources 416 are illustrated in FIG. 4. Sputtering sources 416 are moveable in a vertical direction so that one or both of the sources can be lifted from the slots of the shield. While two sputtering sources are illustrated, any number of sputtering sources can be included, constrained only by space limitations, e.g., one, three, four or more sputtering sources can be included. Typical embodiments for combinatorial processing can include 4 to 6 sputtering sources. Where more than one sputtering source is included, the plurality of sputtering sources may be referred to as a cluster of sputtering sources. Sputtering source shutter 422 can be moved to isolate the lifted sputtering sources from the processing area defined within shield 412. In this manner, the sputtering sources can be isolated from certain processes when desired. It should be appreciated that sputtering source shutter 422 can be integrated with the top of the shield 412 to cover the opening as the sputtering source is lifted or a sputtering source shutter 422 can be used for each site-isolated region.

Top chamber portion 418 of chamber 400 of FIG. 4 includes sidewalls and a top plate which house shield 412. Arm extensions 416a, which are fixed to sputtering sources 416 can be attached to a suitable drive, e.g., lead screw, worm gear, etc., configured to vertically move sputtering sources 416 toward or away from a top plate of top chamber portion 418. In typical use for high deposition rate sputtering, the sputtering target is positioned such that the target-to-substrate spacing is from about 20 mm to about 100 mm from the substrate, which is much closer than the typical spacing of 80-300 mm used in most sputtering systems. In some embodiments, the target-to-substrate spacing is from about 50 mm to about 75 mm. A larger spacing can reduce the deposition rate while a smaller spacing can make it difficult to strike and sustain the plasma.

Figure 5:
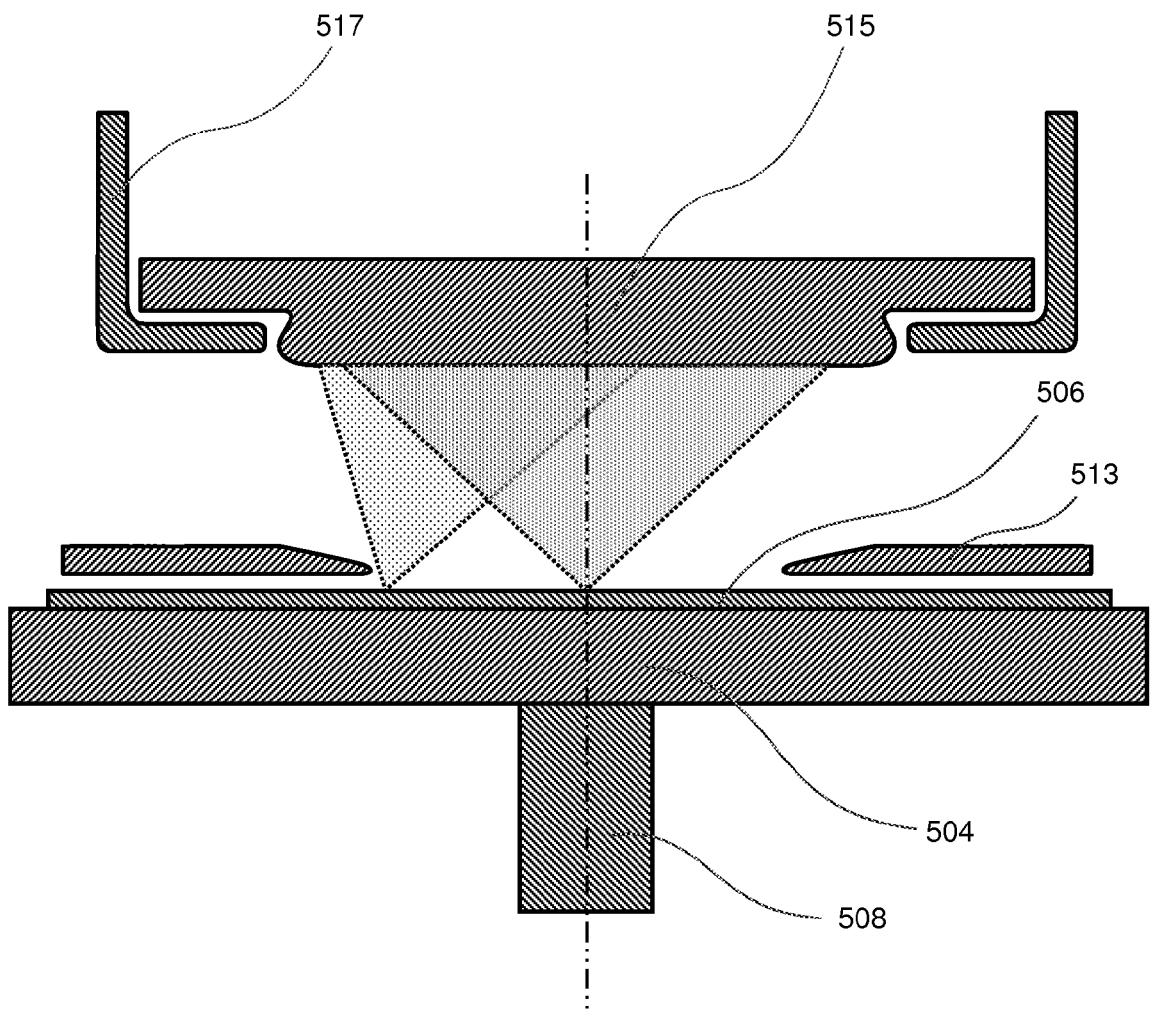
FIG. 5 shows a close-up view of the region between a sputtering target and a substrate.

FIG. 5 shows a close-up view of the region between a sputtering target 515 and a substrate support 504. The sputtering target 515 is disposed in the ground shield 517. The substrate support has a rotation axis 508. In order to provide a substantially uniform deposition rate across a site-isolated substrate area 506 as limited by an aperture in aperture plate 513, the sputtering target erosion area is about 1.5 times larger than the site-isolated substrate area. As illustrated by the triangles showing deposition to the center and edge of the site-isolated substrate area, there can still be some variation in the deposition rate, because not all areas of the sputtering target can provide equal deposition rate to all portions of the site-isolated substrate area. However, typical magnetron/target assemblies often develop an erosion groove near the target edge indicating higher sputtering rates near the edge of the target. This effect can be tuned to compensate for the geometric effect of close target-to-substrate spacing and provide for more nearly uniform deposition rate across the entire site-isolated substrate area.

The dual-axis rotation/revolution system for the substrate support show in FIG. 3 and FIG. 4 as illustrated is configured to position any substrate area under a single aperture centered in the chamber. Commonly, the revolution axis 410 is located half-way between the center and edge of the substrate, e.g., for a system designed to handle wafers up to 300 mm in diameter, the revolution axis 410 would be located 75 mm from the rotation axis 408 allowing the rotation axis 408 to be displaced up to 150 mm from the center of the chamber. Depending on the location of a plurality of sputtering sources such as the four sputtering sources shown in FIG. 4, these dimensions might not be sufficient to allow all areas of the substrate to be positions under each sputtering source. One of ordinary skill will recognize, however, that suitable modifications can be made to either a dual-axis rotation/revolution system or other substrate transport systems such as an X-Y table to extend the movement range to position any substrate area under any sputtering source.

Figure 6:
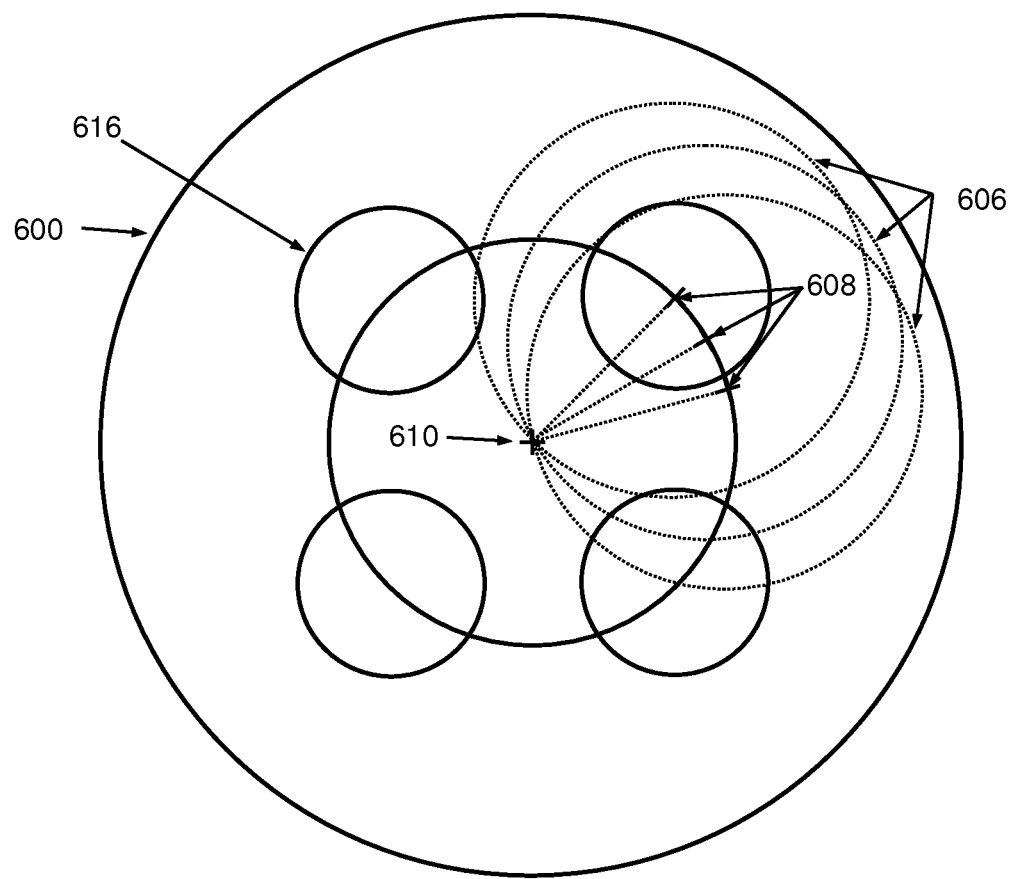
FIG. 6 shows one arrangement of a dual-axis rotation/revolution system that can position any substrate area under each of a plurality of sputtering sources

FIG. 6 shows an exemplary embodiment with four sputtering sources arranged in a circle around the central axis of a chamber 600. In this embodiment, the revolution axis 610 has been moved to the center of the chamber, and the rotation axis 608 (shown in three positions) is located on the circle containing the centers of each sputtering source 616. As the center of the substrate 606 passes through the center of each sputtering source during revolution around axis 610, any radial position from the center to the edge can be positioned under any sputtering source. Rotation about axis 608, in turn, can position any angular position under the sputtering source.

Compared to the apparatus of co-owned U.S. patent application Ser. No. 13/281,316 entitled "High Metal Ionization Sputter Gun," embodiments of the apparatuses of the present invention contain certain components that are similarly arranged. The apparatuses of the instant invention include separate apertures and site-isolated regions opposite each sputter source, and the source-to-substrate spacing is substantially less. The deposition rates can be substantially higher.

Embodiments of the present invention provide methods of depositing layers on a substrate at a high deposition rate. Compared to conventional small-gun sputtering using the apparatus configuration of FIG. 3, the inventive apparatuses can achieve deposition rates of about 1 Å/s, or 2-4 times the rate of conventional small-gun sputtering. A 1000 Å thick electrode layer can be formed in a sputtering time of about 16 minutes instead of greater than 1 hour. In addition, as a result of shortened deposition time, the layer can exhibit substantially higher film quality with fewer contaminants such as oxygen which can increase the resistivity of a conductive layer.

HPC experiments can be designed to test a range of process parameters associated with the present high-deposition rate sputtering apparatuses. Process parameters include sputtering parameters, sputtering atmosphere parameters, and substrate parameters. Sputtering parameters typically comprise exposure times, power, sputtering target material, target-to-substrate spacing, or combinations thereof. Sputtering atmosphere parameters typically comprise total pressure, carrier gas composition, carrier gas flow rate, reactive gas composition, reactive gas flow rate, or combinations thereof. The reactive gas flow rate can be set to zero for depositing layers in the absence of reactive gases and adjusted upwards for depositing layers in the presence of reactive gases. The substrate parameters typically comprise substrate material and surface condition, substrate temperature, substrate bias, or combinations thereof.

Applications

Typical HPC experiments that can be performed using high deposition rate sputtering include, for example, the optimization of process parameters for the formation of thick film layers for use as electrodes. Such films can be made of metals such as Ti, Ta, or Pt which can be sputtered directly in an argon atmosphere, or can be made of metal nitrides such as TiN, TaN, or HfN by reactive sputtering in an atmosphere comprising argon and nitrogen. Combinatorial experiments can be designed where each site-isolated region on a substrate is exposed to different combinations of the various process parameters identified above.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. An apparatus for high-deposition-rate sputtering comprising
    a process chamber;
    a plurality of sputtering sources disposed within the process chamber, wherein each sputtering source comprises a sputtering target;
    a substrate support disposed within the process chamber, the substrate support operable to support a substrate, wherein the spacing between the sputtering target and the substrate forms a target-to substrate spacing of less than 100 mm;
    a shield positioned between the sputtering sources and the substrate, the shield comprising a plurality of apertures, wherein each of the plurality of apertures is positioned respectively under each sputtering source and adjacent to but not touching the substrate such that a single aperture is associated with each sputtering source, wherein the plurality of apertures define site-isolated regions on the substrate, each site-isolated region having an area approximately the same as the corresponding aperture; and wherein all of the substrate outside each site-isolated region is protected from exposure to sputtered material by the shield;
    a transport system connected to the substrate support capable of positioning the substrate such that one of the plurality of site-isolated regions on the substrate can be exposed to sputtered material through the aperture positioned under each of the sputtering sources; and
    a controller with software configured to control sputtering process parameters independently for each site-isolated region;
    wherein the apparatus is configured to provide processing conditions that are uniform within a site-isolated region and distinct from one site-isolated region to another.

2. The apparatus of claim 1, wherein the apparatus is operable to vary one or more sputtering process parameters.

3. The apparatus of claim 2, wherein the sputtering process parameters comprise one or more sputtering parameters, sputtering atmosphere parameters, substrate parameters, or combinations thereof.

4. The apparatus of claim 1, wherein sputtering process parameters can be varied in a combinatorial manner among the plurality of site-isolated regions.

5. The apparatus of claim 3, wherein the sputtering process parameters comprise exposure times, power, sputtering target material, target-to-substrate spacing, or combinations thereof.

6. The apparatus of claim 3, wherein the sputtering atmosphere parameters comprise total pressure, carrier gas composition, carrier gas flow rate, reactive gas composition, reactive gas flow rate, or combinations thereof.

7. The apparatus of claim 6, wherein the reactive gas flow rate is great than or equal to zero.

8. The apparatus of claim 3, wherein the substrate parameters comprise substrate material, surface condition, substrate temperature, substrate bias, or combinations thereof.

9. The apparatus of claim 1, wherein each sputtering source is oriented normal to the substrate.

10. The apparatus of claim 1, further comprising an aperture shutter for each aperture, wherein the aperture shutter is moveably disposed over the aperture.

11. The apparatus of claim 1, wherein the substrate support is capable of providing independent substrate temperature control and applying a bias voltage.

12. The apparatus of claim 1, further comprising four, five, or six sputtering sources.

13. The apparatus of claim 1, wherein the target-to-substrate spacing is between about 20 mm and about 100 mm.

14. The apparatus of claim 13, wherein the target-to-substrate spacing is between about 50 mm and about 75 mm.

15. The apparatus of claim 1, wherein the transport system is operable to position any region of the substrate under any of the plurality of apertures.

* * * * *